(12) United States Patent
Leobandung

(10) Patent No.: US 8,802,512 B2
(45) Date of Patent: Aug. 12, 2014

(54) OVERLAP CAPACITANCE NANOWIRE

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/739,182

(22) Filed: Jan. 11, 2013

(65) Prior Publication Data

US 2014/0197370 A1   Jul. 17, 2014

(51) Int. Cl.
*H01L 21/8238*  (2006.01)
*H01L 29/775*   (2006.01)
*H01L 29/66*    (2006.01)

(52) U.S. Cl.
CPC ........ *H01L 29/66439* (2013.01); *H01L 29/775* (2013.01)
USPC .......................................... 438/154; 438/151

(58) Field of Classification Search
CPC .... H01L 29/66; H01L 21/336; H01L 21/8238
USPC ...................... 257/9; 438/154, 151
See application file for complete search history.

(56) References Cited

U.S. PATENT DOCUMENTS

| | | | |
|---|---|---|---|
| 6,770,516 B2 | 8/2004 | Wu et al. | |
| 7,259,425 B2 | 8/2007 | An et al. | |
| 7,671,418 B2 | 3/2010 | Topaloglu | |
| 7,944,003 B2 | 5/2011 | Ban et al. | |
| 8,106,459 B2 | 1/2012 | Chang et al. | |
| 2006/0172497 A1* | 8/2006 | Hareland et al. | 438/286 |
| 2008/0079041 A1 | 4/2008 | Suk et al. | |
| 2010/0155835 A1 | 6/2010 | Seliskar | |
| 2011/0062411 A1* | 3/2011 | Bangsaruntip et al. | 257/9 |
| 2011/0133162 A1* | 6/2011 | Bangsaruntip et al. | 257/24 |
| 2011/0284967 A1 | 11/2011 | Cheng et al. | |
| 2012/0153387 A1* | 6/2012 | Murthy et al. | 257/335 |

OTHER PUBLICATIONS

Leobandung, E., et al. "Improved Overlap Capacitance Nanowire" Final Office Action mailed on Mar. 10, 2014 for U.S. Appl. No. 13/970,931. (7 Pages).
Office Action mailed on Jun. 16, 2014 for U.S. Appl. No. 13/970,931.

* cited by examiner

*Primary Examiner* — Kevin Parendo
*Assistant Examiner* — Lamont Koo
(74) *Attorney, Agent, or Firm* — Tutunjian & Bitetto, P.C.; Louis J. Percello

(57) ABSTRACT

A device and method for fabricating a nanowire include patterning a first set of structures on a substrate. A dummy structure is formed over portions of the substrate and the first set of structures. Exposed portions of the substrate are etched to provide an unetched raised portion. First spacers are formed about a periphery of the dummy structure and the unetched raised portion. The substrate is etched to form controlled undercut etched portions around a portion of the substrate below the dummy structure. Second spacers are formed in the controlled undercut etched portions. Source/drain regions are formed with interlayer dielectric regions formed thereon. The dummy structure is removed. The substrate is etched to release the first set of structures. Gate structures are formed including a top gate formed above the first set of structures and a bottom gate formed below the first set of structures to provide a nanowire.

15 Claims, 9 Drawing Sheets

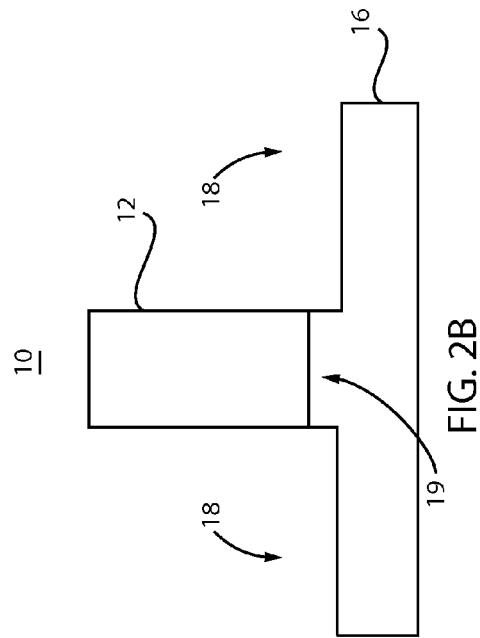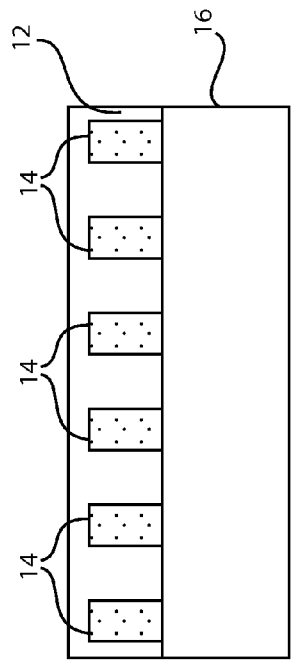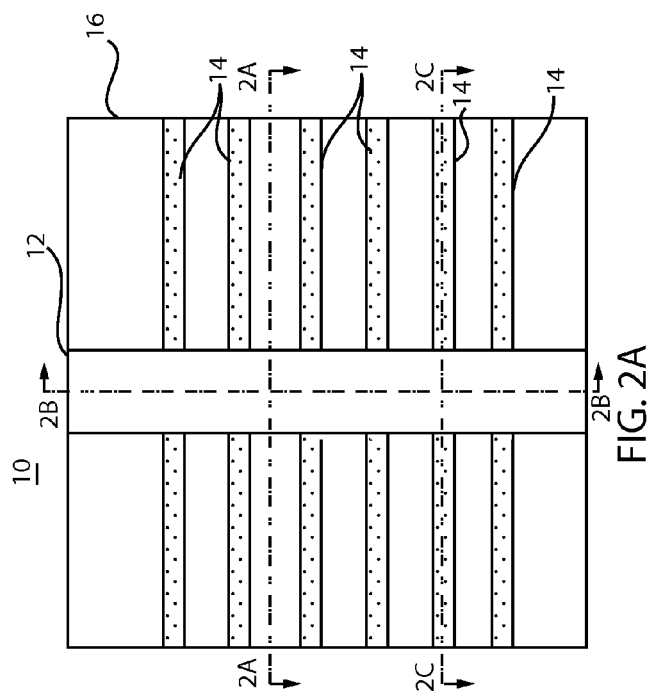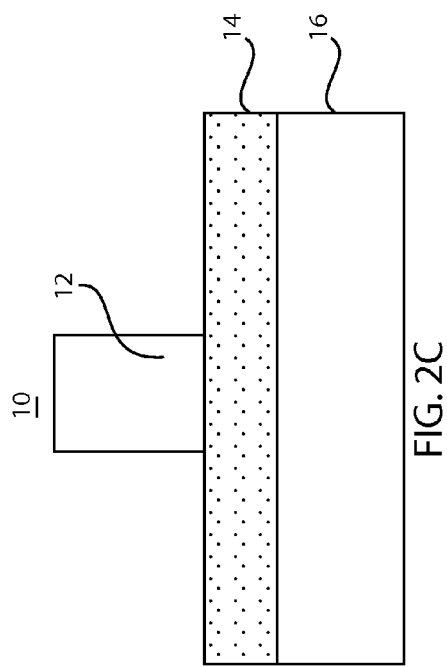

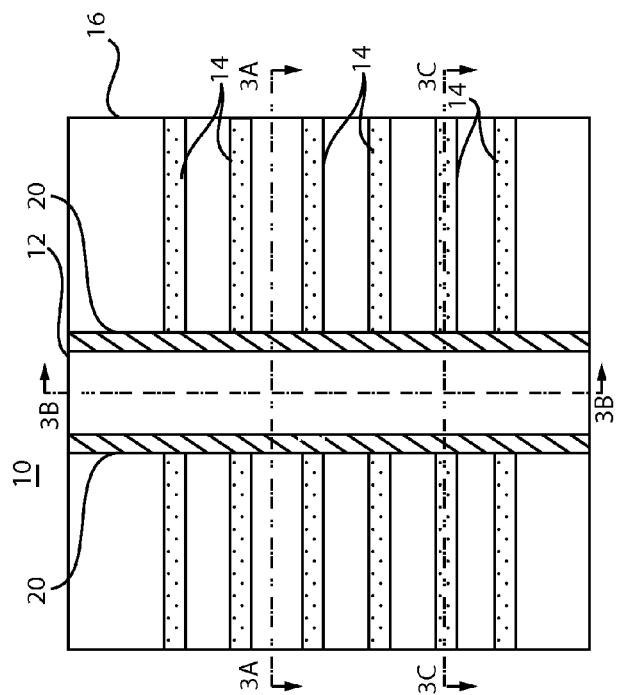
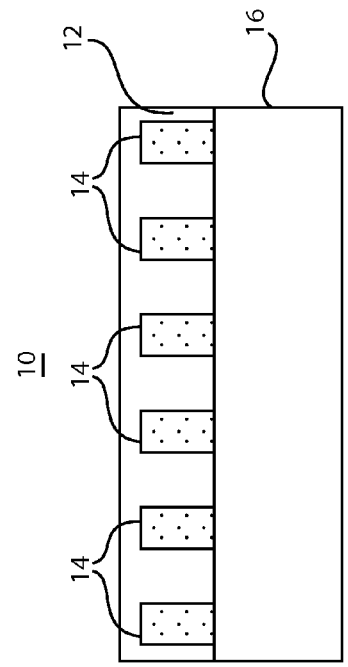
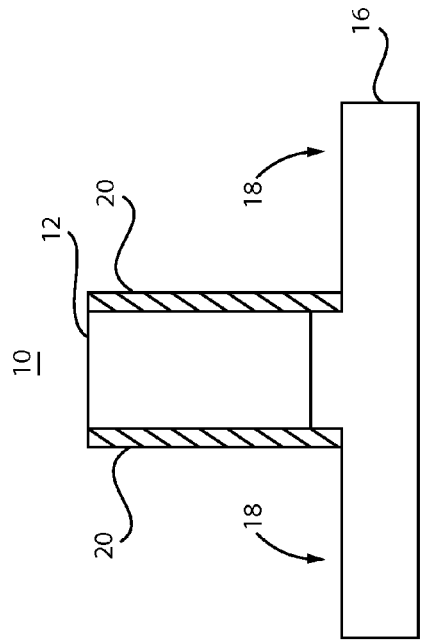
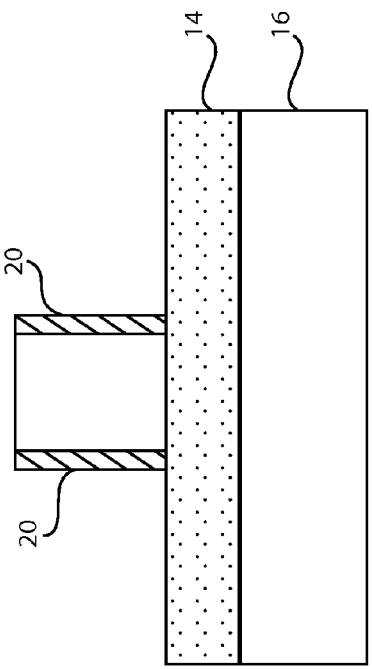
FIG. 3A
FIG. 3B
FIG. 3C
FIG. 3D

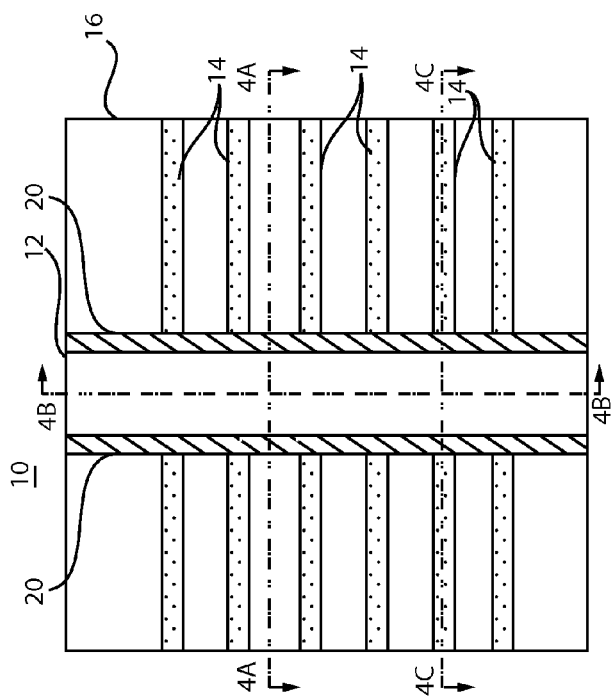
FIG. 4A
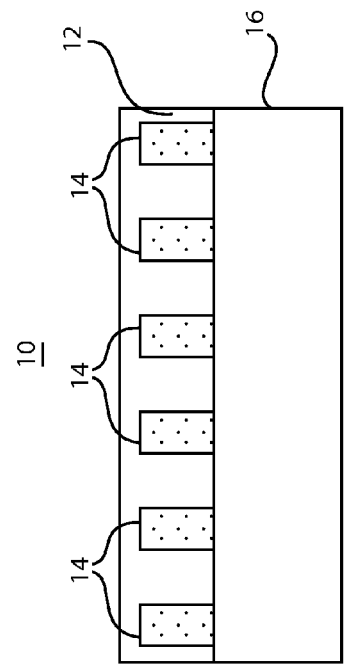
FIG. 4B
FIG. 4C
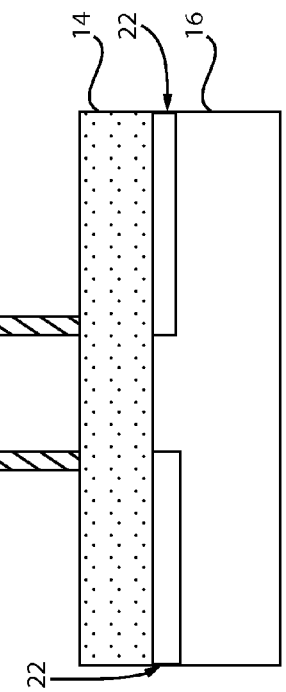
FIG. 4D

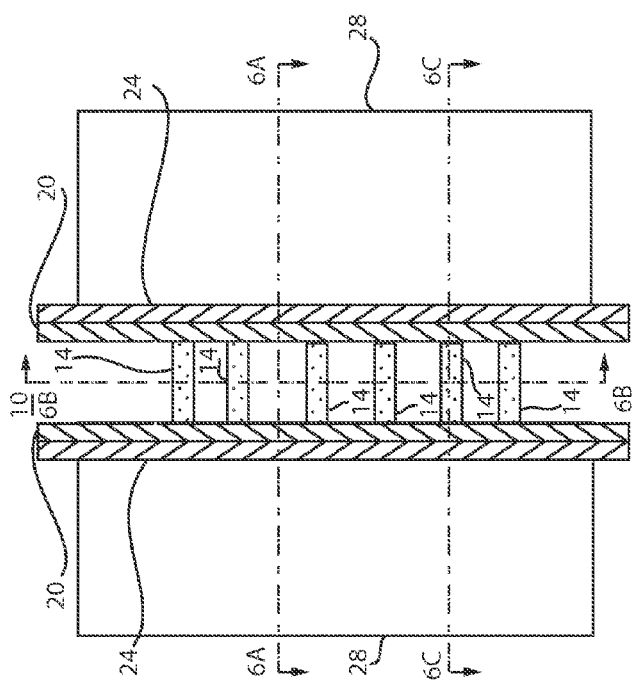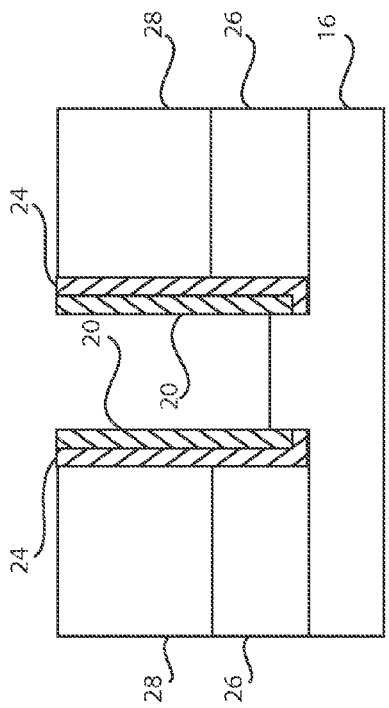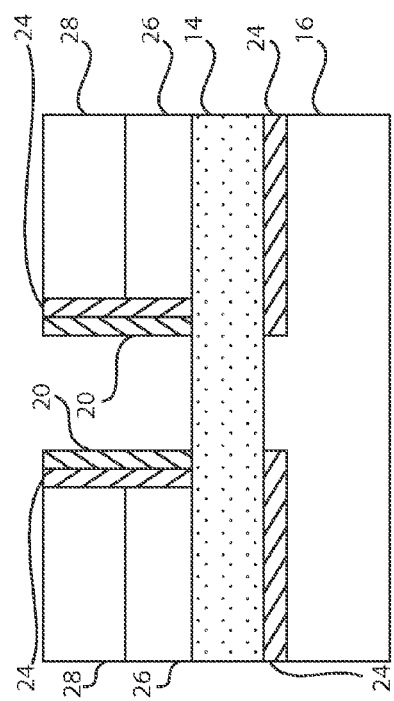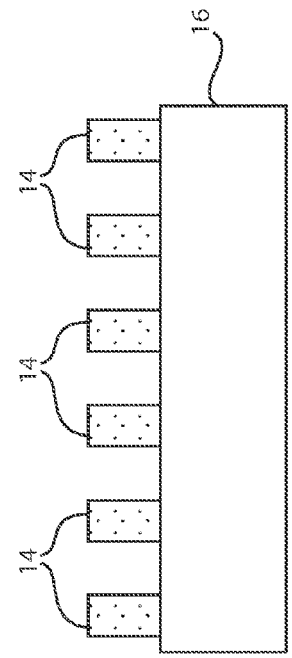

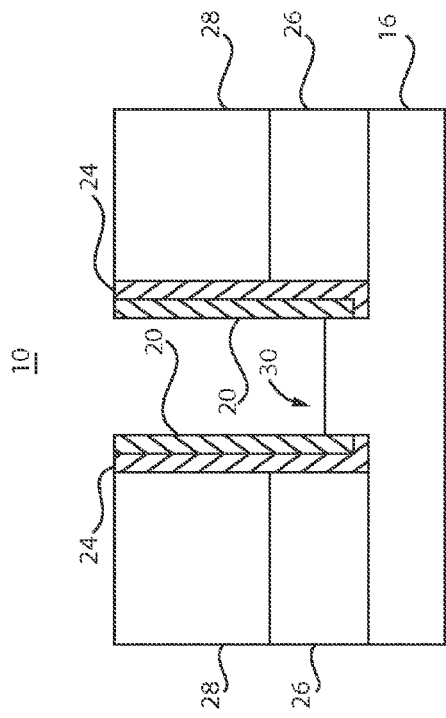
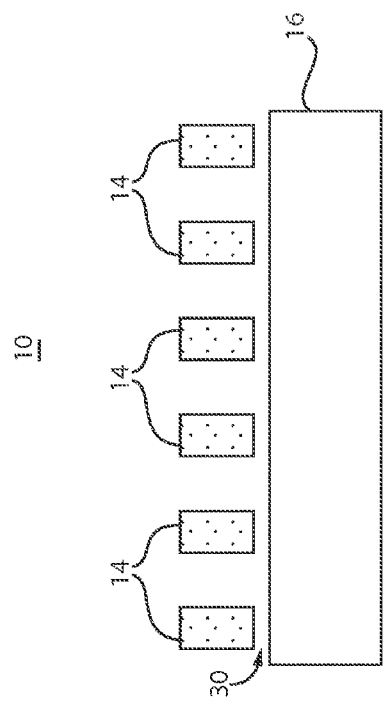
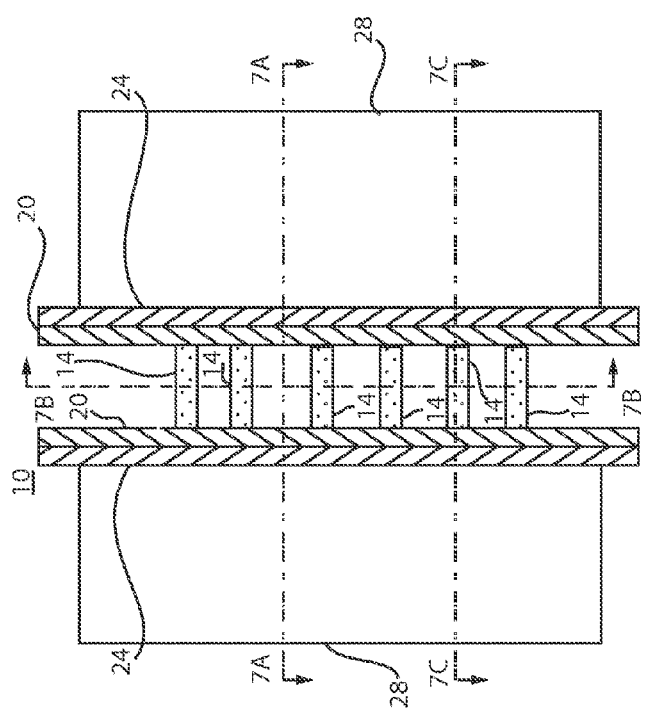
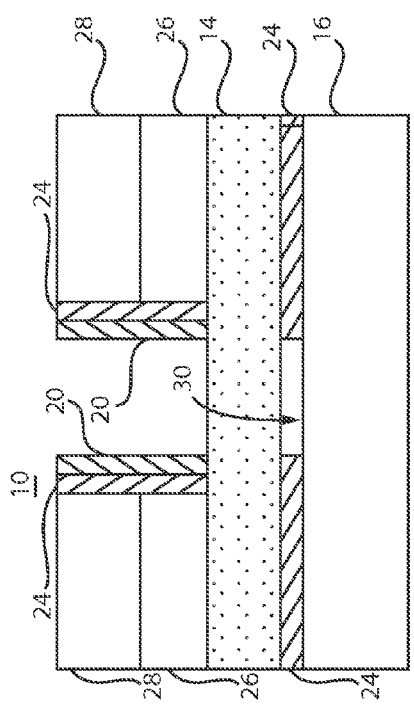
FIG. 7A
FIG. 7B
FIG. 7C
FIG. 7D

OVERLAP CAPACITANCE NANOWIRE

BACKGROUND

1. Technical Field

The present invention relates to nanowires, and more particularly to nanowires having improved overlap capacitance.

2. Description of the Related Art

A nanowire is a structure having a diameter in the order of a nanometer. Nanowires promise to be the next device structure to allow device scaling. However, nanowires are very difficult to manufacture due to their three-dimensional nature. While several solutions have been proposed, these solutions may include a number of drawbacks. For example, the proposed solutions may include a non-manufacturable process or the fabricated nanowire may have a high parasitic capacitance.

SUMMARY

A method for fabricating a nanowire includes patterning a first set of structures on a substrate. A dummy structure is formed over portions of the substrate and the first set of structures. Exposed portions of the substrate are etched to provide an unetched raised portion. First spacers are formed about a periphery of the dummy structure and the unetched raised portion. The substrate is etched to form controlled undercut etched portions around a portion of the substrate below the dummy structure. Second spacers are formed in the controlled undercut etched portions. Source/drain regions are formed with interlayer dielectric regions formed thereon. The dummy structure is removed. The substrate is etched to release the first set of structures. Gate structures are formed including a top gate formed above the first set of structures and a bottom gate formed below the first set of structures to provide a nanowire.

A method for fabricating a nanowire includes patterning fin structures on a substrate. A dummy structure is formed over portions of the substrate and the fin structures. Exposed portions of the substrate are etched to provide an unetched raised portion. First sidewall spacers are formed about a periphery of the dummy structure and the unetched raised portion. The substrate is etched to form controlled undercut etched portions around a portion of the substrate below the dummy structure. Second spacers are formed in the controlled undercut etched portions. Source/drain regions are formed with interlayer dielectric regions formed thereon. The dummy structure is removed. The substrate is etched to release the fin structures. Metal gate structures are formed including a top gate formed above the fin structures and a bottom gate formed below the fin structures to provide a nanowire such that edges of the top gate and the bottom gate are aligned.

A semiconductor device includes one or more structures formed on a substrate. A top gate is formed above the one or more structures and between first spacers. A bottom gate is formed below the one or more structures and between second spacers. Source/drain regions are formed having interlayer dielectric regions formed thereon.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 2A is a top view of the structure of FIG. 1A having an etched substrate surface, in accordance with the present principles;

FIG. 2B is a cross-sectional view taken at section line 2A-2A of FIG. 2A, in accordance with the present principles;

FIG. 2C is a cross-sectional view taken at section line 2C-2C of FIG. 2A, in accordance with the present principles;

FIG. 2D is a cross-sectional view taken at section line 2B-2B of FIG. 2A, in accordance with the present principles;

FIG. 3A is a top view of the structure of FIG. 2A having spacers formed about a periphery of the dummy structure, in accordance with the present principles;

FIG. 3B is a cross-sectional view taken at section line 3A-3A of FIG. 3A, in accordance with the present principles;

FIG. 3C is a cross-sectional view taken at section line 3C-3C of FIG. 3A, in accordance with the present principles;

FIG. 3D is a cross-sectional view taken at section line 3B-3B of FIG. 3A, in accordance with the present principles;

FIG. 4A is a top view of the structure of FIG. 3A, wherein the substrate is further etched to provide undercut portions, in accordance with the present principles;

FIG. 4B is a cross-sectional view taken at section line 4A-4A of FIG. 4A, in accordance with the present principles;

FIG. 4C is a cross-sectional view taken at section line 4C-4C of FIG. 4A, in accordance with the present principles;

FIG. 4D is a cross-sectional view taken at section line 4B-4B of FIG. 4A, in accordance with the present principles;

FIG. 6A is a top view of the structure of FIG. 5A having source/drain regions and interlayer dielectric regions formed and the dummy structure removed, in accordance with the present principles;

FIG. 6B is a cross-sectional view taken at section line 6A-6A of FIG. 6A, in accordance with the present principles;

FIG. 6C is a cross-sectional view taken at section line 6C-6C of FIG. 6A, in accordance with the present principles;

FIG. 6D is a cross-sectional view taken at section line 6B-6B of FIG. 6A, in accordance with the present principles;

FIG. 7A is a top view of the structure of FIG. 6A having portions of the substrate etched to release the fin structures, in accordance with the present principles;

FIG. 7B is a cross-sectional view taken at section line 7A-7A of FIG. 7A, in accordance with the present principles;

FIG. 7C is a cross-sectional view taken at section line 7C-7C of FIG. 7A, in accordance with the present principles;

FIG. 7D is a cross-sectional view taken at section line 7B-7B of FIG. 7A, in accordance with the present principles;

DETAILED DESCRIPTION OF PREFERRED EMBODIMENTS

Figure 1A:
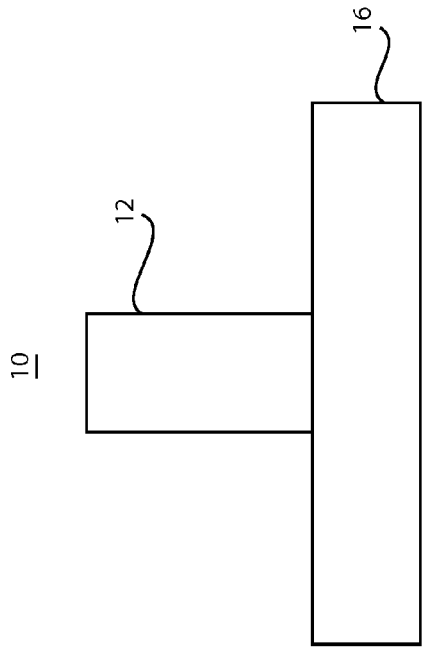
FIG. 1A is a top view of a semiconductor device including a substrate having fin structures and a dummy structure formed thereon, in accordance with the present principles.

In accordance with the present principles, a method and a device are provided for fabricating a nanowire having improved overlap capacitance. A semiconductor device includes a substrate, which may include a buried oxide layer. Fins are patterned thereon and a polysilicon dummy structure is formed over a portion of the substrate and fins. Exposed portions of the substrate are etched and first spacers are formed around a periphery of the dummy structure and unetched raised portions of the substrate.

The substrate is further etched to provide a controlled undercut of the substrate below the first spacers and the fins. Second spacers are formed in the undercut portions of the substrate. Source/drain regions are formed, and interlayer dielectric layers are formed thereon to provide electoral separation. The dummy structure is then removed to etch the substrate, thereby releasing the fins. This may include etching portions of the substrate between the second spacers. Metal gate structures are formed to provide a top gate and a bottom gate. Advantageously, the edges of the top gate and bottom gate are aligned to prevent stray capacitance between the gates. The present principles are compatible with standard fin field effect transistor processing and is, therefore, very manufacturable.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The flowchart and block diagrams in the Figures illustrate the architecture, functionality, and operation of possible implementations of systems and methods according to various embodiments of the present invention. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 1B:
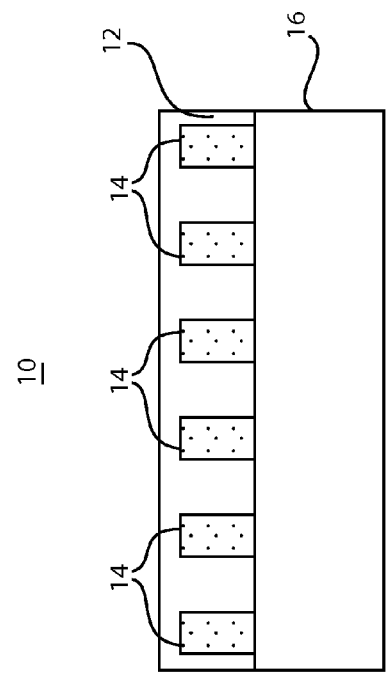
FIG. 1B is a cross-sectional view taken at section line 1A-1A of FIG. 1A, in accordance with the present principles.
Figure 1C:
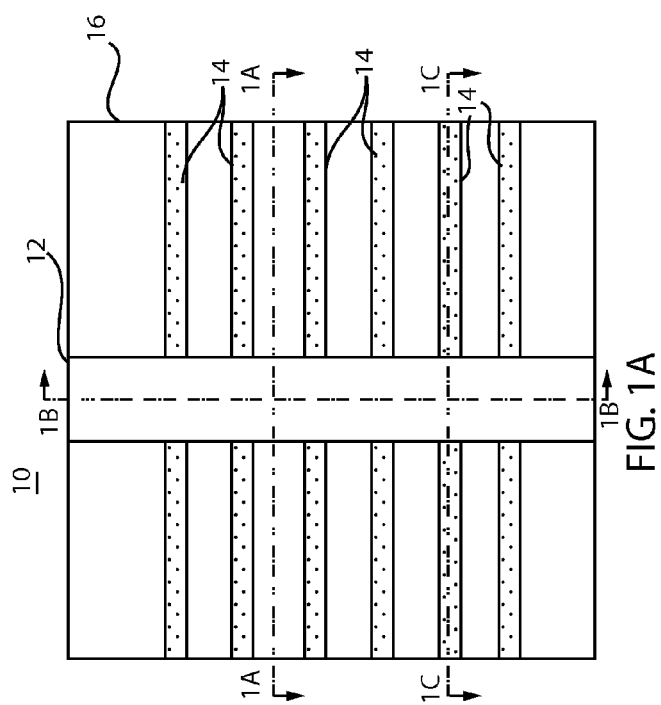
FIG. 1C is a cross-sectional view taken at section line 1C-1C of FIG. 1A, in accordance with the present principles.
Figure 1D:
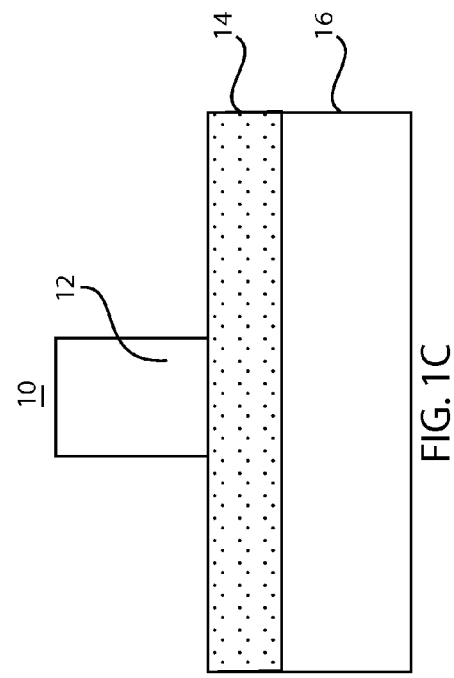
FIG. 1D is a cross-sectional view taken at section line 1B-1B of FIG. 1A, in accordance with the present principles.

Referring now to the drawings in which like numerals represent the same or similar elements and initially to FIG. 1A, a top-down view of a semiconductor device 10 is illustratively depicted in accordance with one embodiment. FIG. 1B shows a cross-sectional view of the semiconductor device 10 at section line 1A-1A. FIG. 1C shows a cross-sectional view of the semiconductor device 10 at section line 1C-1C. FIG. 1D shows a cross-sectional view of the semiconductor device 10 at section line 1B-1B.

The device 10 includes a substrate 16. The substrate 16 preferably includes a buried oxide (BOX) layer, however other materials may be employed. For example, substrate 16 may include any suitable material, such as, e.g., a Semiconductor-on-Insulator (SOI) or bulk substrate that may include Gallium, Arsenide, monocrystalline silicon, Germanium, or any other suitable material or combination of materials.

Fins 14 are patterned over the substrate 16 using known techniques. Fins 14 preferably have a width of or about, e.g., 8 nanometers. Fins 14 may include any suitable material, such as, e.g., Gallium, Arsenide, monocrystalline silicon, Germanium, or any other suitable material or combination of materials. A dummy structure 12 is formed over a portion of the substrate 16 and fins 14. The dummy structure 12 preferably includes polysilicon, however other suitable material or combination of materials may be employed. The dummy structures 12 may be formed by any suitable technique (e.g., deposition). In some embodiments, the substrate 16 further comprises other features or structures that are formed in or on the semiconductor substrate 16 in previous steps.

Referring now to FIG. 2A, the semiconductor device 10 of FIG. 1A is processed to form etched portions 18. FIG. 2B shows a cross-sectional view of the semiconductor device 10 at section line 2A-2A. FIG. 2C shows a cross-sectional view of the semiconductor device 10 at section line 2C-2C. FIG. 2D shows a cross-sectional view of the semiconductor device 10 at section line 2B-2B.

Exposed portions 18 of the substrate 16 are etched to formed unetched raised portions 19 of the substrate. The exposed portions 18 may include portions of the substrate 16 that are not covered by dummy structure 12 and/or fins 14. Etching preferably includes reactive ion etching (RIE), however other forms of etching are also contemplated (e.g., wet chemical etch, dry plasma etch, combinations of wet chemical etch and dry plasma etch, etc.). Etched substrate portions 18 are preferably etched to a depth of or about, e.g., 5 nanometers.

Referring now to FIG. 3A, the semiconductor device 10 of FIG. 2A is processed to form first offset spacers 20 about a periphery of the dummy structure 12 and unetched raised portions 19 of the substrate. FIG. 3B shows a cross-sectional view of the semiconductor device 10 at section line 3A-3A. FIG. 3C shows a cross-sectional view of the semiconductor device 10 at section line 3C-3C. FIG. 3D shows a cross-sectional view of the semiconductor device 10 at section line 3B-3B.

The first spacers 20 may include a nitride material, for example. The spacer material may be conformally deposited over the device 10 and etched (e.g., RIE, etc.) to leave first spacers 20 along the sidewalls of the dummy structure and the unetched raised portions 19 of the substrate. The first spacers 20 are preferably at half thickness of the desired offset spacer thickness, to have a width of or about, e.g., 5 nanometers.

Referring now to FIG. 4A, processing of semiconductor device 10 of FIG. 3A continues to form undercut portions 22 of the substrate 16. FIG. 4B shows a cross-sectional view of the semiconductor device 10 at section line 4A-4A. FIG. 4C shows a cross-sectional view of the semiconductor device 10 at section line 4C-4C. FIG. 4D shows a cross-sectional view of the semiconductor device 10 at section line 4B-4B.

The surface of the substrate 16 is etched by, e.g., a buffered oxide etch (BOE) using hydrofluoric (HF) acid. HF acid is preferably applied to the surface of the substrate 16 such that undercut portions 22 beneath the fins 14 are also etched. The undercut portions 22 include portions of the substrate 16 beneath the fin 14 and first spacers 20, while portions of the substrate under the dummy structure 12 and above layers (e.g., fins 14, spacers 20) remain unaffected. The undercut portions 22 are controlled by adjusting the dilution of HF acid applied in the BOE. The substrate 16 is preferably etched to a depth of or about, e.g., 5 nanometers. It should be understood that any suitable etching technique may be employed, such as, e.g., wet chemical etch method, dry plasma etch method, etc.

Figure 5B:
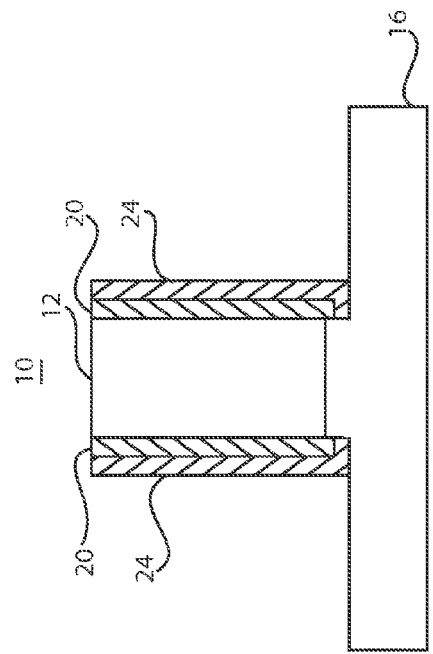
FIG. 5B is a cross-sectional view taken at section line 5A-5A of FIG. 5A, in accordance with the present principles.
Figure 5D:
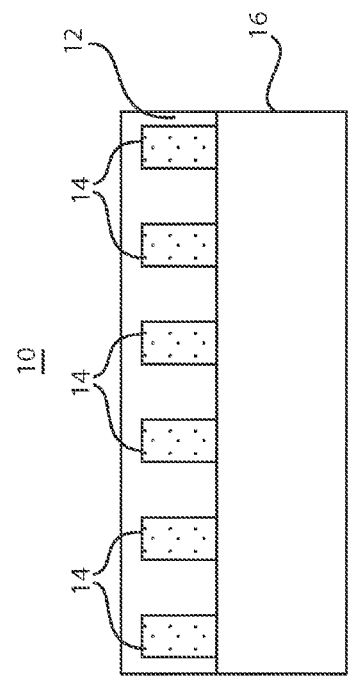
FIG. 5D is a cross-sectional view taken at section line 5B-5B of FIG. 5A, in accordance with the present principles.
Figure 5A:
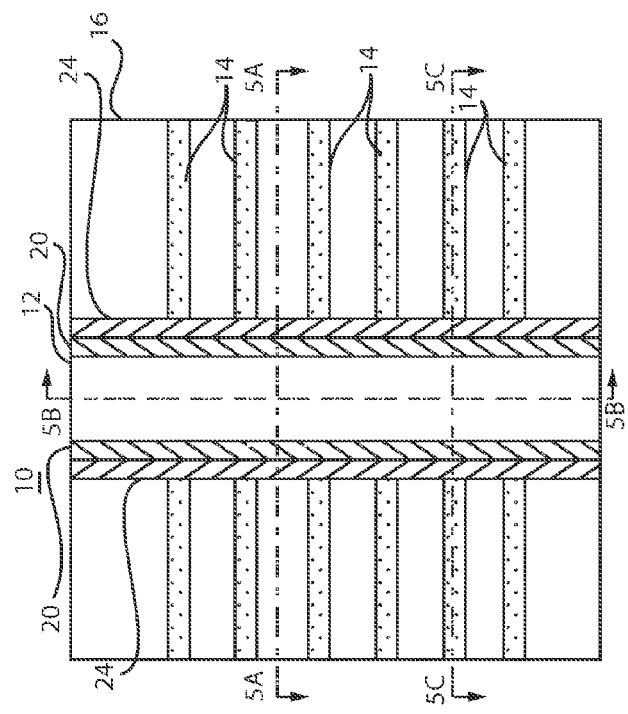
FIG. 5A is a top view of the structure of FIG. 4A having spacers formed along a surface of the substrate, in accordance with the present principles.
Figure 5C:
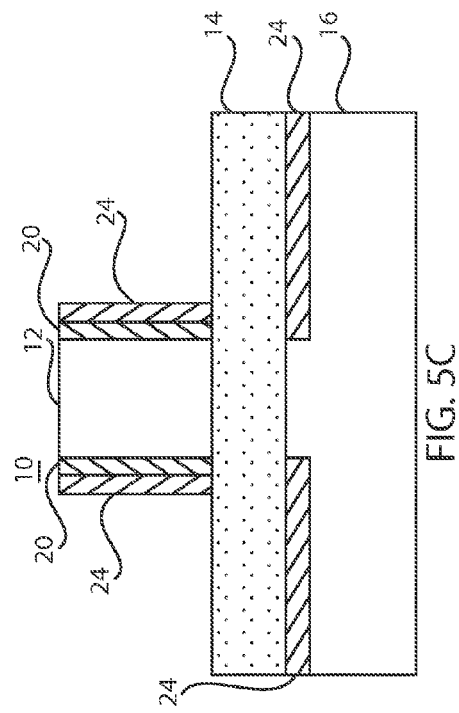
FIG. 5C is a cross-sectional view taken at section line 5C-5C of FIG. 5A, in accordance with the present principles.

Referring now to FIG. 5A, the semiconductor device 10 of FIG. 4 is processed to form second offset spacers 24 formed over the first offset spacers 20 and in the undercut portions 22. FIG. 5B shows a cross-sectional view of the semiconductor device 10 at section line 5A-5A. FIG. 5C shows a cross-sectional view of the semiconductor device 10 at section line 5C-5C. FIG. 5D shows a cross-sectional view of the semiconductor device 10 at section line 5B-5B.

The second spacers 24 may include, e.g., nitride material. The spacer material may be conformally deposited over the surface of the device 10 and etched (e.g., RIE, etc.) to remove horizontal components of the spacer material, leaving second spacers 24 over first spacers 20. The second spacers 24 are formed at half size of the desired thickness over first spacers 20, to form full size sidewall spacers. Advantageously, the second spacers 24 formed in the undercut portions 22 remain after the etch since they are covered by the fins 14. The second spacers 24 preferably have a thickness of or about, e.g., 5 nanometers.

Referring now to FIG. 6A, the semiconductor device 10 of FIG. 5 is processed. FIG. 6B shows a cross-sectional view of the semiconductor device 10 at section line 6A-6A. FIG. 6C shows a cross-sectional view of the semiconductor device 10 at section line 6C-6C. FIG. 6D shows a cross-sectional view of the semiconductor device 10 at section line 6B-6B.

Source/drain (S/D) regions 26 are formed over the substrate 16 and fins 14. An epitaxy is preferably employed to form the S/D regions 26, which may include epitaxially growing silicon, germanium, or other suitable material or combination of materials. Interlayer dielectric (ILD) regions 28 are formed over S/D regions 26 to provide electrical separation. ILD regions 28 may be formed by depositing dielectric material over the surface of the device 10 and planarizing to the surface of the dummy structure 12. The dummy structure 12 is then removed by applying, e.g., any suitable etching technique to selectively etch the polysilicon of the dummy structure 12.

Referring now to FIG. 7A, the semiconductor device 10 of FIG. 6A is processed to etch a portion 30 of the substrate 16 to release fins 14. FIG. 7B shows a cross-sectional view of the semiconductor device 10 at section line 7A-7A. FIG. 7C shows a cross-sectional view of the semiconductor device 10 at section line 7C-7C. FIG. 7D shows a cross-sectional view of the semiconductor device 10 at section line 7B-7B.

Exposed portions of the substrate 16 are etched to release fins 14. Etching may include employing a BOE with HF acid. HF acid may be applied to the exposed surface of the substrate 16 such that an undercut portion 30 is etched. Undercut portion 30 may be controlled by adjusting the dilution of the HF acid. The undercut portion 30 may include the portion below the fins 14 and between the second spacers 24. Other suitable etching techniques may also be employed. Substrate 16 is preferably etched to a depth of or about, e.g., 6 nanometers.

Figure 8A:
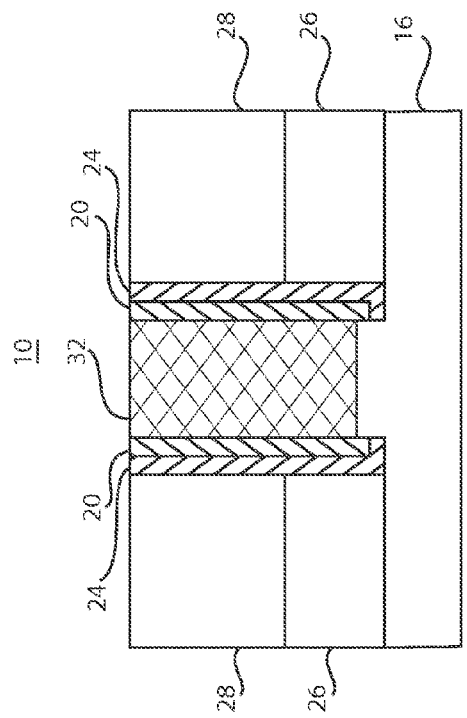
FIG. 8A is a top view of the structure of FIG. 7A having metal gates formed above and below the fin structures, in accordance with the present principles.
Figure 8B:
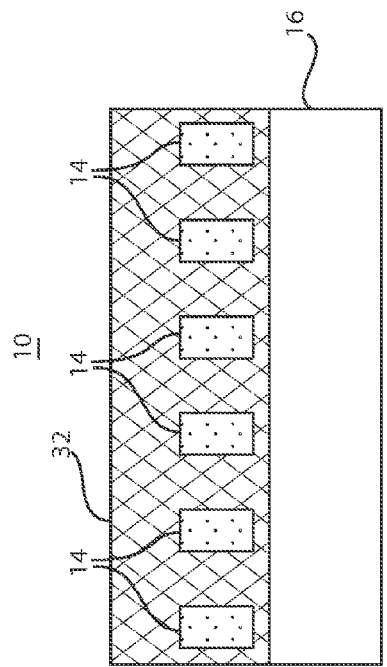
FIG. 8B is a cross-sectional view taken at section line 8A-8A of FIG. 8A, in accordance with the present principles.
Figure 8C:
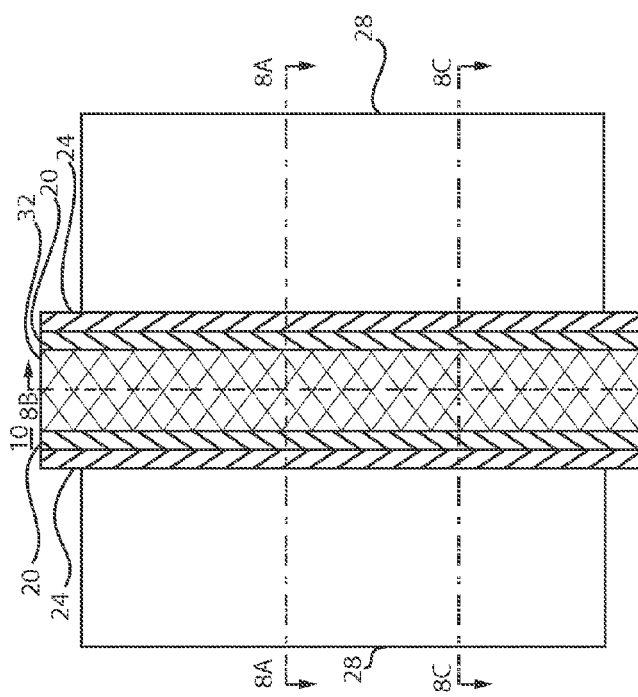
FIG. 8C is a cross-sectional view taken at section line 8C-8C of FIG. 8A, in accordance with the present principles.
Figure 8D:
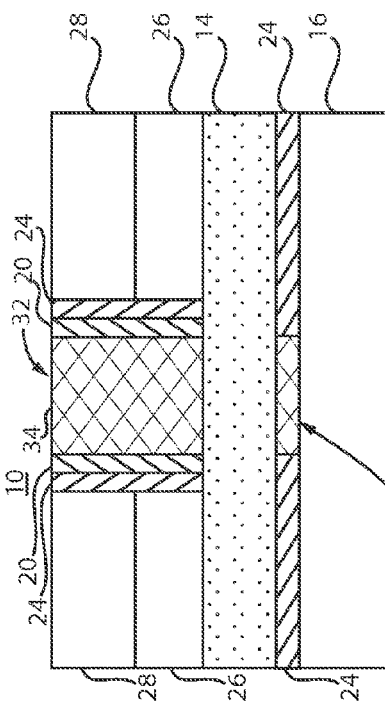
FIG. 8D is a cross-sectional view taken at section line 8B-8B of FIG. 8A, in accordance with the present principles.

Referring now to FIG. 8A, the semiconductor device 10 of FIG. 7A is processed to form gate structures 32. FIG. 8B shows a cross-sectional view of the semiconductor device 10 at section line 8A-8A. FIG. 8C shows a cross-sectional view of the semiconductor device 10 at section line 8C-8C. FIG. 8D shows a cross-sectional view of the semiconductor device 10 at section line 8B-8B.

Gate structures 32 preferably include metal gate structures. Metal gate material may be deposited over the device 10 and planarized, e.g., chemical-mechanical planarization (CMP), down to the surface of the ILD regions 28. Other suitable techniques may also be employed. Gate structures 32 include a top gate 34 and a bottom gate 36. The edges of the top gate 34 and the bottom gate 36 are preferably aligned such that there is no overlap to cause stray capacitance between the gates. Advantageously, the second spacers 24 (e.g., a nitride layer) are on both sides of the bottom gate 36 to prevent expansion of the bottom gate 36 and maintain the alignment of the edges of the top gate 34 and bottom gate 36. Fins 14 are provided as nanowires. As can be seen, the gate structures 32 are formed on all four sides of each of the fins 14.

Figure 9:
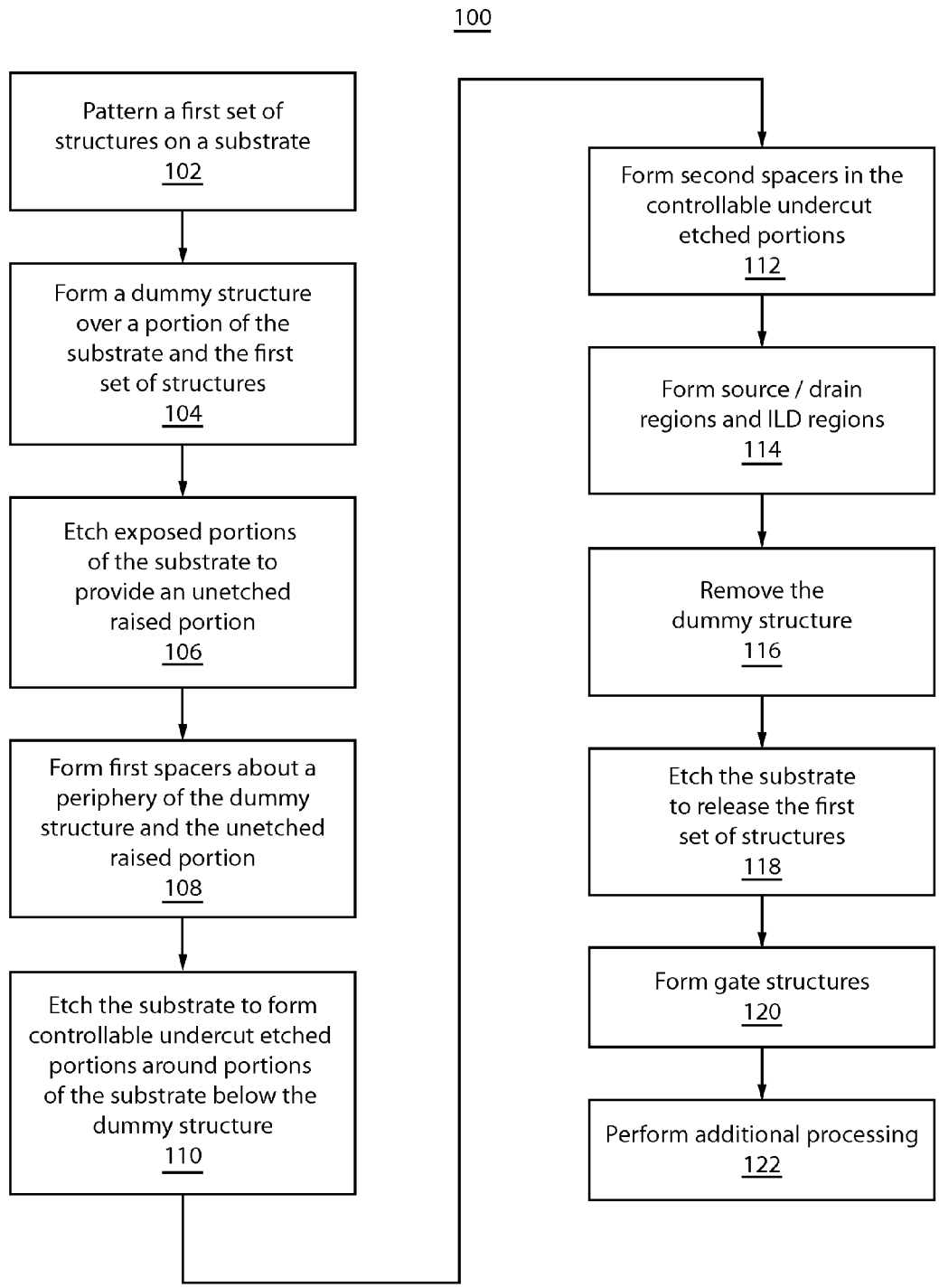
FIG. 9 is a block/flow diagram showing a system/method for fabricating nanowires, in accordance with the present principles.

Referring now to FIG. 9, a block/flow diagram showing a method 100 for fabricating a nanowire is illustratively depicted in accordance with one illustrative embodiment. In block 102, a first set of structures are patterned on a substrate. The substrate preferably includes a BOX layer, however other suitable materials may be employed, such as, e.g., an SOI or bulk substrate material or combination of materials. The substrate may include other features formed in or on the substrate in previous process steps. In one embodiment, the first set of structures includes at least one fin, which may be patterned using any suitable lithographic method. The at least one fin may include any suitable material.

In block 104, a dummy structure is formed over a portion of the substrate and the first set of structures. The dummy structure preferably includes polysilicon, however other suitable material or combination of materials may also be employed. The dummy structure may be formed by, e.g., deposition or any other suitable method.

In block 106, exposed portions of the substrate are etched to form an unetched raised portion of the substrate. Exposed portions may include portions of the substrate that are not covered by the dummy structure or the first set of structures. Etching may include RIE, or other suitable etching methods.

In block 108, first spacers are formed about a periphery of the dummy structure and the unetched raised portion of the substrate. The first spacers include sidewall spacers and may be formed from a silicon nitride (nitride) or other similar material. The first spacers are preferably formed at half of a desired width.

In block 110, the substrate is etched to form undercut etched portions around a portion of the substrate below the dummy structure. Undercut etched portions of the substrate may include portions below the first spacers and below the first set of structures. Preferably, portions of the substrate not covered by the dummy structure are etched, while above layers remain unaffected. Undercut etched portions of the substrate are controlled by adjusting etching parameters (e.g., dilution of HF acid, etc.) Etching may include a BOE using HF acid, however other suitable etching methods may also be applied. In block 112, second spacers are formed over the first spacers and in the undercut portions. The second spacers may be formed from a silicon nitride (nitride) or other similar material. The second spacers are preferably at half of the desired width, such that the second spacers formed over the first spacers form full sidewall spacers.

In block 114, source/drain regions and interlayer dielectric regions are formed. Forming S/D regions may include epitaxially growing silicon, germanium, or other suitable material or combination of materials. ILD regions are formed over S/D regions by, e.g., deposition and planarization to electrically separate devices. In block 116, the dummy structure is selectively removed by applying any suitable etching method (e.g., reactive ion etch, etc.).

In block 118, portions of the substrate are etched to release the first set of structures. The etched portions preferably include portions between the second spacers and below the first set of structures. Etching may include any suitable etching method.

In block 120, gate structures are formed. Preferably, metal gate structures are formed by deposition and chemical-mechanical planarization, or by any other suitable methods. Metal gates may be formed above and below the first set of structures to form a top gate and a bottom gate. The edges of the top gate and bottom gate are preferably aligned such that there is no overlap to cause stray capacitance between the gates. Second spacers (e.g., a nitride layer) are on both sides of the bottom gate to prevent the expansion of the bottom gate and maintain the alignment between the edges of the top gate and the bottom gate. The first set of structures are provided as nanowires. The gate structures are formed on all four sides of each of the structures.

In block 122, additional processing may be performed. Additional processing may include forming field effect transistors, forming other structures, etc.

Having described preferred embodiments of a system and method for improved overlap capacitance nanowire (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a nanowire, comprising:
   etching exposed portions of a substrate to provide an unetched raised portion, the substrate having a first set of structures formed thereon and a dummy structure formed over at least a portions of the substrate and the first set of structures;
   forming first spacers about a periphery of the dummy structure and the unetched raised portion;
   etching the substrate to form controlled undercut etched portions around a portion of the substrate below the dummy structure;
   forming second spacers in the controlled undercut etched portions;
   removing the dummy structure;
   etching the substrate to release the first set of structures; and
   forming gate structures including a top gate formed above the first set of structures and a bottom gate formed below the first set of structures such that the second spacers are employed to align edges of the bottom gate to the top gate.

2. The method as recited in claim 1, wherein forming gate structures includes forming metal gate structures.

3. The method as recited in claim 1, wherein forming gate structures includes forming the top gate and the bottom gate such that edges of the top gate and bottom gate are aligned.

4. The method as recited in claim 1, wherein forming gate structures includes forming the bottom gate between the second spacers.

5. The method as recited in claim 1, wherein etching the substrate to release the first set of structures includes etching the portion of the substrate below the dummy structure to release the first set of structures.

6. The method as recited in claim 1, wherein etching exposed portions of the substrate includes etching exposed portions of the substrate that are not masked by the dummy structure or the first set of structures.

7. The method as recited in claim 1, wherein etching the substrate to form controllable undercut etched portions includes etching a portion of the substrate below the first spacers.

8. The method as recited in claim 1, wherein the first set of structures includes one or more fin structures.

9. The method as recited in claim 1, wherein the dummy structure includes polysilicon.

10. The method as recited in claim 1, further comprising forming source/drain regions with interlayer dielectric regions formed thereon.

11. A method for fabricating a nanowire, comprising:
    patterning fin structures on a substrate;
    forming a dummy structure over portions of the substrate and the fin structures;
    etching exposed portions of the substrate to provide an unetched raised portion;

forming first sidewall spacers about a periphery of the dummy structure and the unetched raised portion;

etching the substrate to form controlled undercut etched portions around a portion of the substrate below the dummy structure;

forming second spacers in the controlled undercut etched portions;

forming source/drain regions with interlayer dielectric regions formed thereon;

removing the dummy structure;

etching the substrate to release the fin structures; and forming metal gate structures including a top gate formed above the fin structures and a bottom gate formed below the fin structures to provide a nanowire such that the second spacers are employed to align edges of the bottom gate to the top gate.

12. The method as recited in claim 11, wherein forming gate structures includes forming a bottom gate between the second spacers.

13. The method as recited in claim 11, wherein etching the substrate to release the fin structures includes etching the portion of the substrate below the dummy structure to release the fin structures.

14. The method as recited in claim 11, wherein etching exposed portions of the substrate includes etching exposed portions of the substrate that are not masked by the dummy structure or the fin structures.

15. The method as recited in claim 11, wherein the dummy structure includes polysilicon.

* * * * *